(12) United States Patent
Huang et al.

(10) Patent No.: US 7,253,762 B2
(45) Date of Patent: Aug. 7, 2007

(54) ESTIMATION CIRCUIT FOR TIME-INTERLEAVED ADC AND METHOD THEREOF

(75) Inventors: Fong-Ching Huang, Hsin-Chu (TW); Chao-Cheng Lee, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/279,556

(22) Filed: Apr. 12, 2006

(65) Prior Publication Data
US 2006/0232460 A1 Oct. 19, 2006

Related U.S. Application Data

(60) Provisional application No. 60/594,511, filed on Apr. 13, 2005.

(30) Foreign Application Priority Data
Nov. 9, 2005 (TW) ............................ 94139265 A

(51) Int. Cl.
*H03M 1/12* (2006.01)
(52) U.S. Cl. ...................... 341/155; 341/120
(58) Field of Classification Search ............... 341/141, 341/155, 120
See application file for complete search history.

(56) References Cited
U.S. PATENT DOCUMENTS
4,763,105 A 8/1988 Jenq

| 5,239,299 A * | 8/1993 | Apple et al. ................. 341/118 |
| 5,294,926 A * | 3/1994 | Corcoran .................... 341/120 |
| 6,384,756 B1* | 5/2002 | Tajiri et al. ................. 341/120 |
| 6,452,518 B1 | 9/2002 | Kawabata |
| 6,700,515 B2* | 3/2004 | Asami ........................ 341/120 |
| 6,809,668 B2* | 10/2004 | Asami ........................ 341/120 |

FOREIGN PATENT DOCUMENTS

JP 2000059219 A * 2/2000
TW 00456108 9/2001

OTHER PUBLICATIONS

Antonio Petraglia and Sanjit K. Mitra., "Analysis of mismatch effects among A/D converters in a time-interleaved waveform digitizer.", IEEE Trans on Instrum. and Meas., Oct. 1991, pp. 831-835, vol. 40, No. 5, 1991 IEEE.
Brad Booth et al, "IEEE 802 10GBASE-T Tutorial,", Nov. 10, 2003, pp. 1-56.
D. Fu, et al., "A digital background calibration technique for time-interleaved analog-to-digital converters.", IEEE J. of Solid-State Circuits, Dec. 1998, pp. 1904-1911, vol. 33, No. 12, 1998 IEEE.

(Continued)

*Primary Examiner*—Howard L. Williams
(74) *Attorney, Agent, or Firm*—Winston Hsu

(57) ABSTRACT

The present invention provides an apparatus and a method for estimating at least one of timing, gain, and offset errors of a time-interleaved ADC. The apparatus has a first ADC, a second ADC, a converter, an estimator, and a compensator. The converter has a Fourier Transform converter and a calculator.

19 Claims, 10 Drawing Sheets

OTHER PUBLICATIONS

Huawen Jin, Edward K. F. Lee, "A Digital-Background Calibration Technique for Minimizing Timing-Error Effects in Time-Interleaved ADC's.", IEEE Trans. on Circuits and Systems-II: Analog and Digital Signal Processing, Jul. 2000, pp. 603-613, vol. 47, No. 7, 2000 IEEE.

J. Elbornsson et al, "Blind adaptive equalization of mismatch errors in a time-interleaved A/D converter system." Trans. on Circuits and Systems-I: Regular Papers, Jan. 2004, pp. 151-158, vol. 51, No. 1, 2004 IEEE.

N. Kurosawa et al, "Explicit analysis of channel mismatch effects in time-interleaved ADC systems." IEEE Trans. on Circuits and Systems-I: Fundamental Theory and Applications., Mar. 2001, pp. 261-271, vol. 48, No. 3, 2001 IEEE.

Yih-Chyun Jenq., "Digital Spectra of nonuniformly sampled signals: fundamentals and high-speed waveform digitizers.", IEEE Trans. on Instrum. and Meas., Jun. 1988, pp. 245-251, vol. 37, No. 2, 1988 IEEE.

Yih-Chyun Jenq., "Digital spectra of nonuniformly sampled signals: A robust sampling time offset estimation algorithm for ultra high-speed waveform digitizers using interleaving.". IEEE Trans. on Instrum. and Meas., Feb. 1990, pp. 71-75, vol. 39, No. 1 1990 IEEE.

* cited by examiner

ESTIMATION CIRCUIT FOR TIME-INTERLEAVED ADC AND METHOD THEREOF

CROSS REFERENCE TO RELATED APPLICATIONS

This application claims the benefit of U.S. Provisional Application No. 60/594,511, filed on Apr. 13, 2005 and entitled "TONE-CORRELATOR METHOD TO ESTIMATE TIMING/GAIN/OFFSET ERRORS FOR TIME-INTERLEAVED ADC", the contents of which are incorporated herein by reference.

BACKGROUND OF THE INVENTION

1. Field of the Invention

The present invention relates to an analog to digital converter (ADC), and more particularly, to a correlation circuit for an ADC.

2. Description of the Prior Art

As communication systems advance quickly, ADCs with broad bandwidth and high resolution are required. Time-interleaved ADCs, a.k.a. parallel ADCs, are thereby introduced. This kind of ADC utilizes M parallel ADCs having a sampling frequency $f_s$ and an n-bit resolution. Sample timings of these M ADCs are distributed uniformly within one period $T=1/f_s$. In other words, assuming that the sample timings of the first ADC, $ADC_0$, are (0, T, 2T, ...), the sample timings of the second ADC, $ADC_1$, will be (T/M, T+T/M, 2T+T/M, ...), and the sample timings of the $(i+1)^{th}$ ADC, $ADC_i$, will be (iT/M, 1T+iT/M, 2T+iT/M, ...). As a result, the bandwidth of the original ADC is expanded to M multiple and the n-bit resolution is maintained.

Some errors may occur due to mismatch among ADCs. These potential errors include timing error, gain error, and offset error. Any one of combination of the three errors may degrade the efficiency of the time-interleaved ADC. The timing error affects the efficiency most. Structure of unique sample and hold (S/H) circuit for all ADCs is usually adopted to reduce the timing error. This S/H circuit must be having a very high speed sampling frequency and very accurate circuit.

There are several other methods to estimate the above-mentioned errors. One of them is to input a test sine wave to time-interleaved ADC, and to individually analyze the phase and the amplitude of the output signal of each ADC to obtain information about the timing error and gain error. However, the frequency of the test sine wave is constrained to $(1+s) f_s$, where $-0.5<s<0.5$, and the phase and the amplitude of the output signal can only be estimated in the time domain. Another method is to estimate the timing error of a test sine wave in the frequency domain. However, a highly complicated calculation of DFT/IDFT is necessary in the digital domain. A background compensation method has also been introduced. Before being received by the S/H circuit, an input signal is added to an analog ramp function signal having a period $t_s=1/Mf_s$. If the average (DC component) of the input signal is zero, the information of timing error will hide in the DC component of each ADC output due to the ramp function. This method assumes that the average of the input signals is zero and no offset error exists between ADCs. Still another method is based on a signal statistics principle. If a timing error occurs, a mean square difference between two adjacent ADCs includes information about the timing error. Although this method is a background compensation method and no extra analog signals are required, complicated calculation in the digital domain cannot be avoided.

SUMMARY OF THE INVENTION

The object of the present invention is therefore to provide a estimating circuit and the method for a time-interleaved ADC to solve the above-mentioned problems.

According to a claimed embodiment of the present invention, a method for correcting a time-interleaved analog-to-digital converter (ADC) comprising a first ADC and a second ADC is disclosed. The method includes utilizing the first ADC to sample an input signal with a predetermined sampling frequency to generate a first set of sampled data; utilizing the second ADC to sample the input signal with the predetermined sampling frequency to generate a second set of sampled data; respectively performing a Fourier Transform on the first and the second sets of sampled data to generate a first and a second complex numbers; generating an estimated value according to the first and the second complex numbers; and utilizing the estimated value to correct the second ADC.

DETAILED DESCRIPTION

Figure 1:
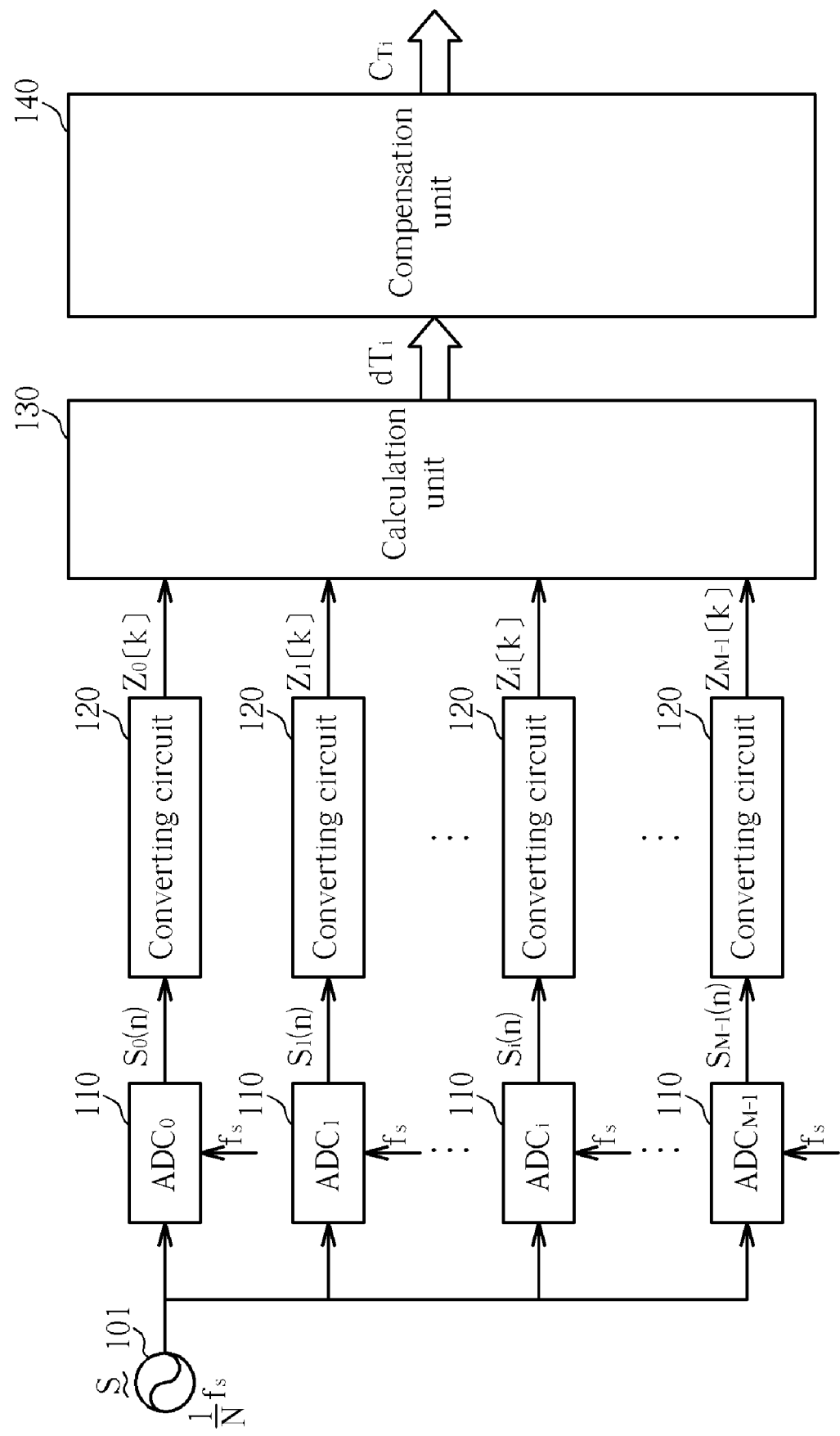
FIG. 1 shows a time-interleaved ADC according to a first embodiment of the present invention.

FIG. 1 shows a time-interleaved ADC according to a first embodiment of the present invention. It is assumed that M ADC 110 ($ADC_0$, $ADC_1$, ..., $ADC_{M-1}$) are included, and each has a sampling frequency of $f_s$. Each ADC 110 receives an analog sine wave S from a signal generator 101. The sine wave S has a frequency of $f_s/N$, N being an integer, i.e., the sampling frequency of each ADC 110 is N multiple of the frequency of the sine wave S. Theoretically, the sampling timings of M ADC 110 should distribute uniformly within one period $T=1/f_s$, i.e., the sampling timing difference between two adjacent ADCs is T/M. Moreover, practically, for the $(i+1)^{th}$ $ADC_i$, the relationship between the input signal $x_i$ and the output $y_i$ is expressed as follows (quantization error is neglected):

$$y_i=(1+a_i)x_i+b_i$$

wherein, $a_i$ is the gain error of the $(i+1)^{th}$ $ADC_i$, and $b_i$ is the offset error. The correction method disclosed in this invention observes the output signals of each ADC in digital domain, and then filters out unnecessary frequency components keeping only the specified frequency components. Information of timing error and gain error is respectively obtained by estimating phase and amplitude of the filtered output signals. In addition, offset error information can also be obtained by averaging the output signals of every ADC.

The frequency of the analog sine wave S is $f_s/N$ if a foreground compensation is applied. If a background compensation is applied the frequency is $f_s/2$ to prevent the high-frequency aliasing components $((1+1/N)f_s, (2+1/N)f_s, \ldots)$ from disturbing the analog sine wave S. However, any existing frequency component of the input signal can be chosen as the analog sine wave S provided that the frequency component has sufficient power.

Each ADC 110 samples every frequency component of the analog sine wave S with respect to the phase of individual sampling timing. The $(i+1)^{th}$ ADC$_i$ obtains sampled data $S_i(n)$, n being the number of sampled data. The sampled data $S_i(n)$ is then received by the converting circuit 120. The converting circuit 120 filters unnecessary frequency components, and analyzes the phase and the amplitude of the output signal of each ADC 100 with respect to the specific frequency component. If the normalized frequency of the specific frequency component is 1/N in the digital domain, the phase difference between two adjacent ADC 110 should be $2\pi/NM$ because the sampling timing of the M ADCs 110 are distributed uniformly. If the phase error caused by the timing error of the $(i+1)^{th}$ ADC$_i$ is assumed to be $\Delta\phi_i$, the phase difference between ADC$_i$ and ADC$_0$ should be $$\varphi_i = \frac{2\pi}{NM}i + \Delta\varphi_i \qquad \text{Eq. (1)}$$

Therefore, the timing error in seconds of the $(i+1)^{th}$ ADC$_i$ is $$dT_i = \frac{NT}{2\pi}\Delta\varphi_i \qquad \text{Eq. (2)}$$

Similarly, the information of gain error of the $(i+1)^{th}$ ADC$_i$ corresponds to the amplitude difference between ADC$_i$ and ADC$_0$.

After filtering out unnecessary frequency components, the converting circuit 120 performs a Fast Fourier Transform (FFT) on the specific frequency component. Since the converting circuit 120 performs the FFT only on the specific component, therefore a single-point FFT is referred to hereafter in this embodiment. The FFT can be regarded as a band-pass filter with an extremely narrow bandwidth that allows only the observed frequency to pass, i.e. the specific frequency. As a result, when the converting circuit 120 performs the FFT on the analog sine wave S, all frequency components except the specific component are filtered out. The converting circuit 120 also generates the amplitude information and the phase information of the analog sine wave S. The FFT can avoid complicated calculation and therefore only the frequency of the analog sine wave $f_s/N$ is taken into consideration. Setting N=L/k, the formula for the FFT is expressed as:

$$Z_i[k] = \sum_{n=0}^{L-1} s_i(n)\cos\left(\frac{2\pi k n}{L}\right) + j\sum_{n=0}^{L-1} s_i(n)\sin\left(\frac{2\pi k n}{L}\right) \qquad \text{Eq. (3)}$$

$$= X_i[k] + jY_i[k] \qquad \text{Eq. (4)}$$

wherein the complex number $Z_i[k]$ represents the result derived from performing the FFT on the sampled data $S_i(n)$ of the $(i+1)^{th}$ ADC$_i$, L being the size of the FFT, and k being any integer between 1 and L/2−1. The size L has no special limitation, but is usually determined to be large enough to ensure a large signal to noise ratio (SNR).

The calculation unit 130 collects all complex numbers $(Z_0[k], Z_1[k], \ldots, Z_{M-1}[k])$ generated by the converting circuit 120 and thereby calculates the arguments ($\theta_0, \theta_1, \ldots, \theta_{M-1}$) of each complex number. Each argument has information about the timing error of its corresponding ADC 110. The calculation unit 130 further calculates timing errors of each ADC according to these arguments. If the first ADC$_0$ establishes the criteria, the timing error $dT_i$ of the $(i+1)^{th}$ ADC$_i$ can be expressed as:

$$dT_i = \frac{NT}{2\pi}\left[(\theta_i - \theta_0)_{mod(2\pi)} - \frac{2\pi}{NM}i\right] \qquad \text{Eq. (5)}$$

As a result, the calculation unit 130 will output a number of M−1 timing errors $(dT_1, dT_2, \ldots, dT_{M-1})$ to the compensation unit 140. The compensation unit 140 generates a plurality of compensation signals $C_{Ti}$ according to the M−1 timing errors to respectively compensate ADC$_1$~ADC$_{M-1}$.

Figure 2:
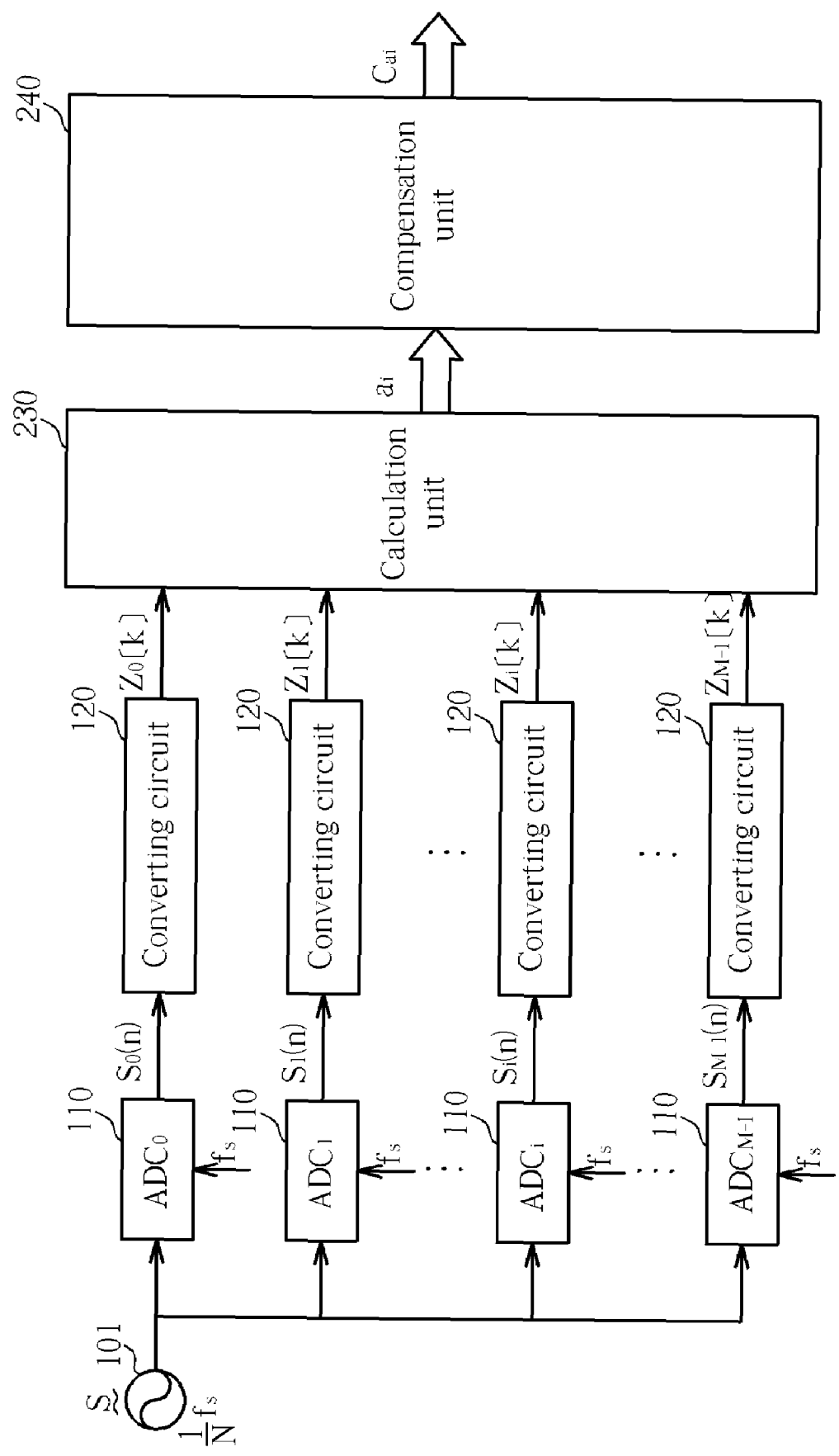
FIG. 2 shows a time-interleaved ADC according to a second embodiment of the present invention.

FIG. 2 shows a correction circuit for a time-interleaved ADC according to a second embodiment of the present invention. The calculation unit 230 collects all complex numbers $(Z_0[k], Z_1[k], \ldots, Z_{M-1}[k])$ generated by the converting circuit 120 and thereby calculates the modulus $(|Z_0|, |Z_1|, \ldots, |Z_{M-1}|)$ of each complex number. Each modulus has information about the gain error of its corresponding ADC 110. The calculation unit 230 further calculates gain errors of each ADC according to the modulus. If the first ADC$_0$ establishes the criteria, the gain error $a_i$ of the $(i+1)^{th}$ ADC$_i$ can be expressed as:

$$a_i = \frac{|Z_i| - |Z_0|}{|Z_0|} \qquad \text{Eq. (6)}$$

As a result, the calculation unit 230 will output a number of M−1 gain errors $(a_1, a_2, \ldots, a_{M-1})$ to the compensation unit 240. The compensation unit 240 generates a plurality of compensation signals $C_{ai}$ according to the M−1 gain errors to respectively compensate ADC$_1$~ADC$_{M-1}$. Please note that in these two embodiments mentioned above, the criteria can be established utilizing any of the ADCs and is not limited to ADC$_0$.

Figure 3:
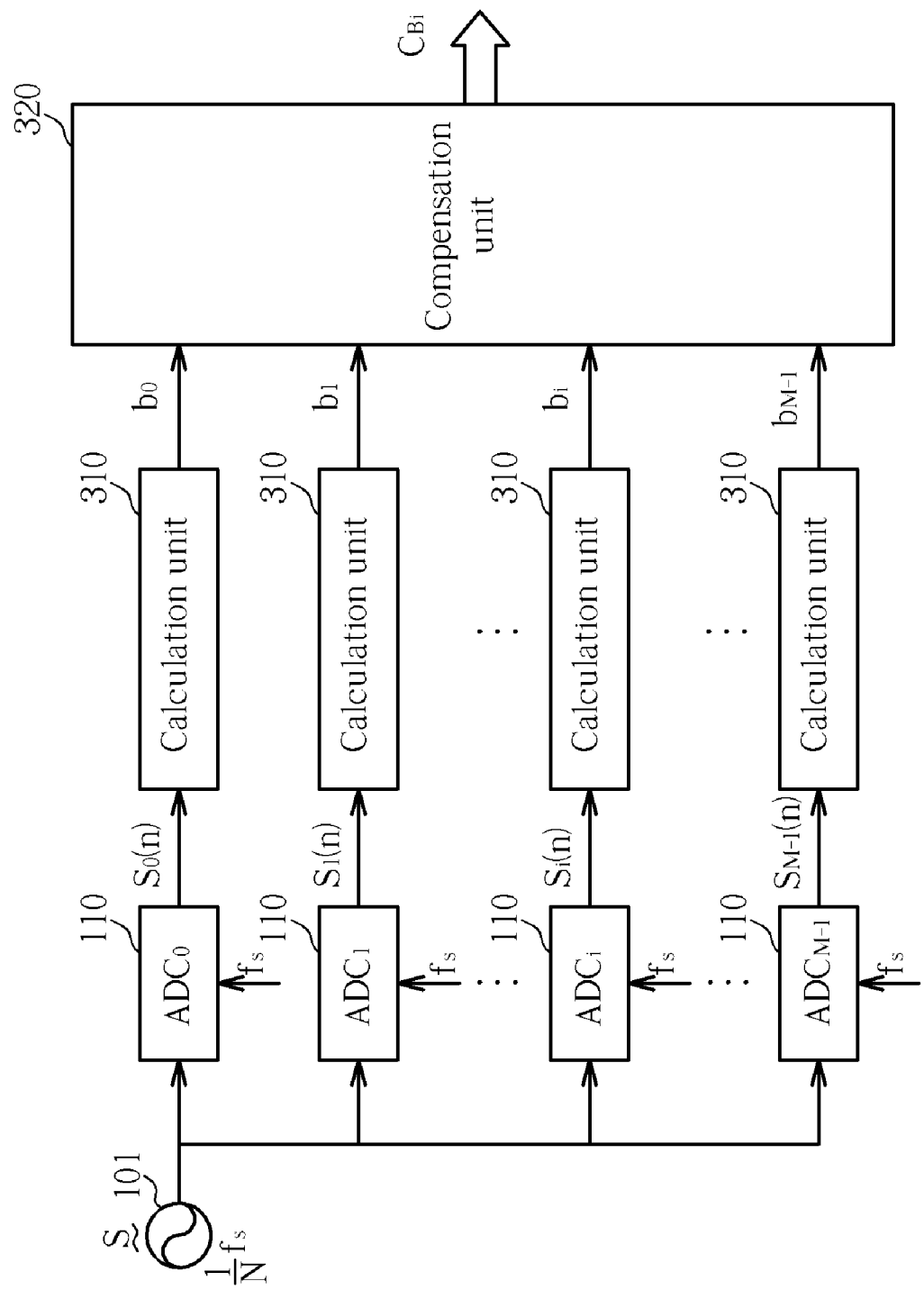
FIG. 3 shows a time-interleaved ADC according to a third embodiment of the present invention.

FIG. 3 shows a correction circuit for a time-interleaved ADC according to a third embodiment of the present invention. The third embodiment is similar to the first and the second embodiments. After sampling the analog sine wave S, each ADC 110 generates a set of sampled data. In this embodiment, each ADC 110 is coupled to a calculation unit 310. The calculation unit 310 calculates the average value of every set of sampled data. That is, the calculation unit 310 calculates each set of sample data $(S_0(n), S_1(n), \ldots, S_{M-1}(n))$ to generate the corresponding average values $(b_0, b_1, \ldots, b_{M-1})$. The compensation unit 320 receives these average values and takes a certain ADC, e.g., ADC$_0$, as the criteria, the offset error $B_i$ of the $(i+1)^{th}$ ADC$_i$ can be expressed as:

$$B_i = b_i - b_0 \qquad \text{Eq. (7)}$$

As a result, the compensation unit 320 will output a plurality of compensation signals $C_{Bi}$ according to the M−1 offset errors to correct offsets of $ADC_1 \sim ADC_{M-1}$.

Figure 4:
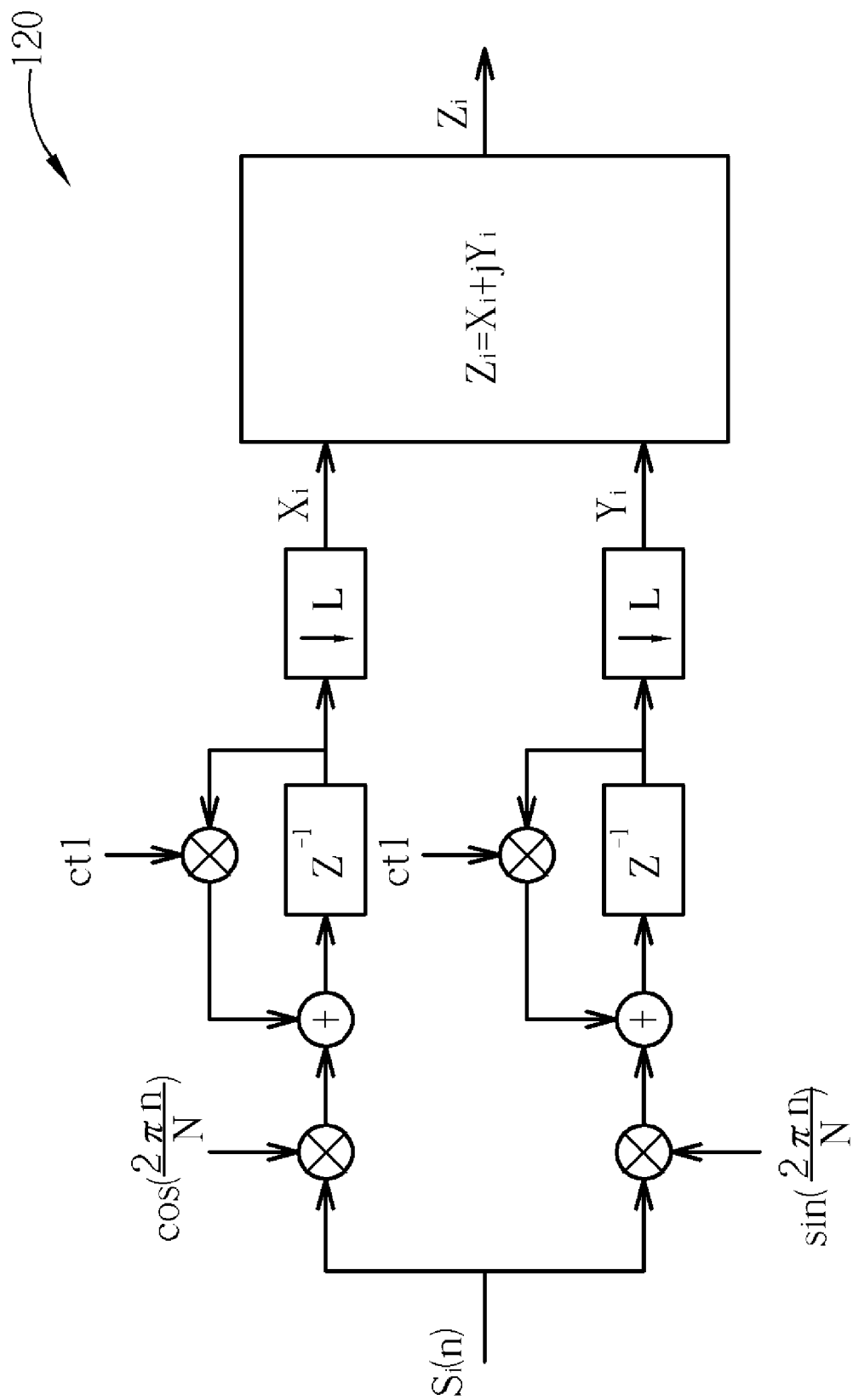
FIG. 4 shows an inner circuit of the converting circuit.
Figure 5:
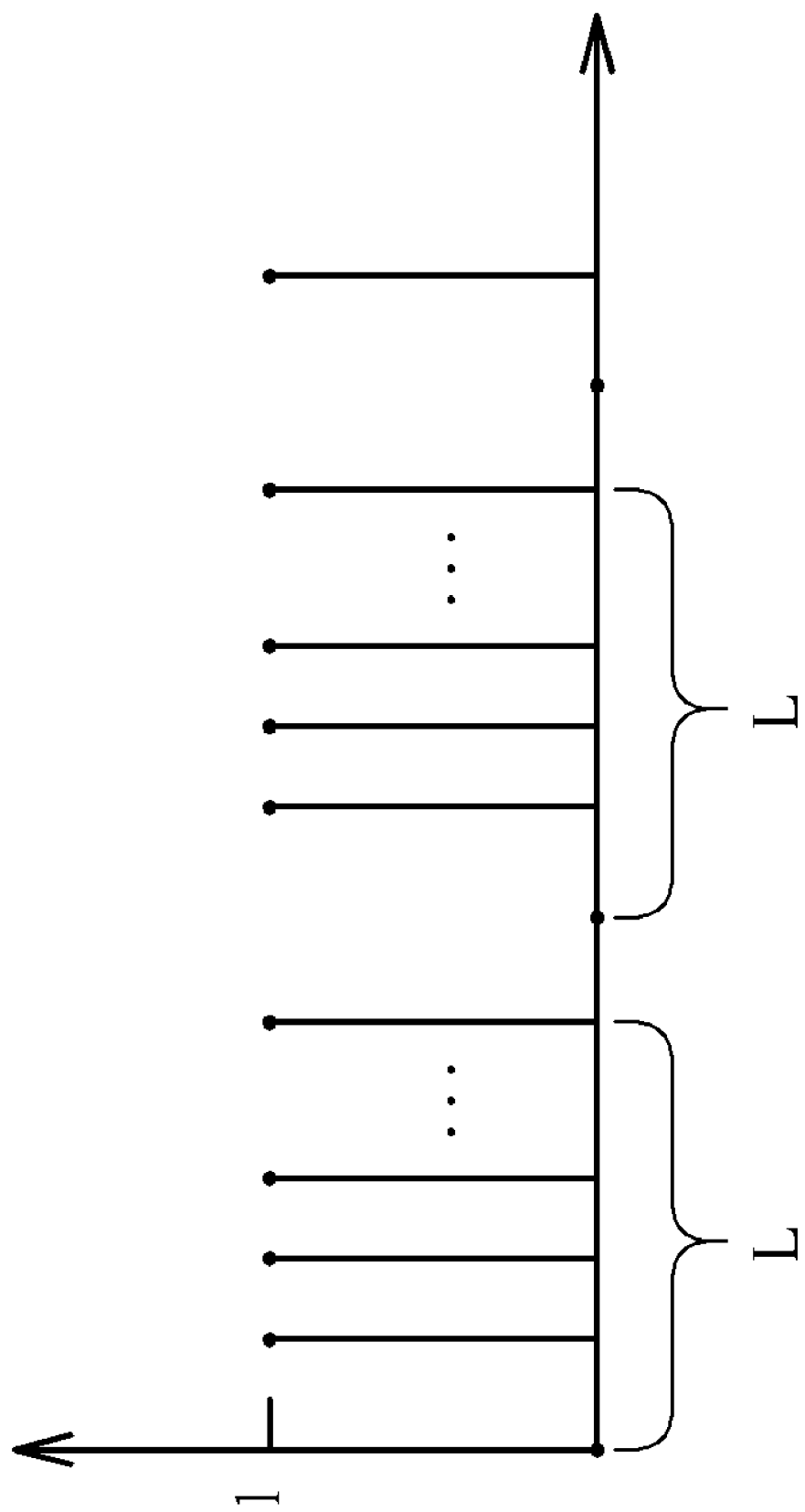
FIG. 5 shows plot of the control signal ctl.

The detailed circuitry of the converting circuit 120 shown in FIGS. 1 and 2 is shown in FIG. 4. According to the FFT formula of Eq. (3), the sampled data $S_i(n)$ are respectively multiplied by $$\cos\left(\frac{2\pi n}{N}\right) \text{ and } \sin\left(\frac{2\pi n}{N}\right),$$

and then the products are accumulated. The control signal ctl is shown in FIG. 5. After every L data are processed (L is size of the FFT), the accumulated result is cleared; therefore the next round of accumulation will not be affected by the current result. The accumulated result is sampled by a down sampling circuit, and the real part ($X_i$) and the imaginary part ($Y_i$) of the complex number $Z_i$ are thereby obtained. A combination of $X_i$ and $Y_i$ generates the complex number $Z_i = X_i + jY_i$. To further simplify the circuitry, the value N can be set to be 4. Consequently, the multipliers $$\cos\left(\frac{2\pi n}{N}\right) \text{ and } \sin\left(\frac{2\pi n}{N}\right) \text{ become } \cos\left(\frac{2\pi}{4}n\right) \text{ and } \cos\left(\frac{2\pi}{4}n\right).$$

In short, the sampled data $S_i(n)$ are respectively multiplied by series [1, 0, −1, 0, 1, 0, . . . ] and [0, 1, 0, −1, 0, 1, . . . ]. The circuitry is thereby simplified.

Figure 6:
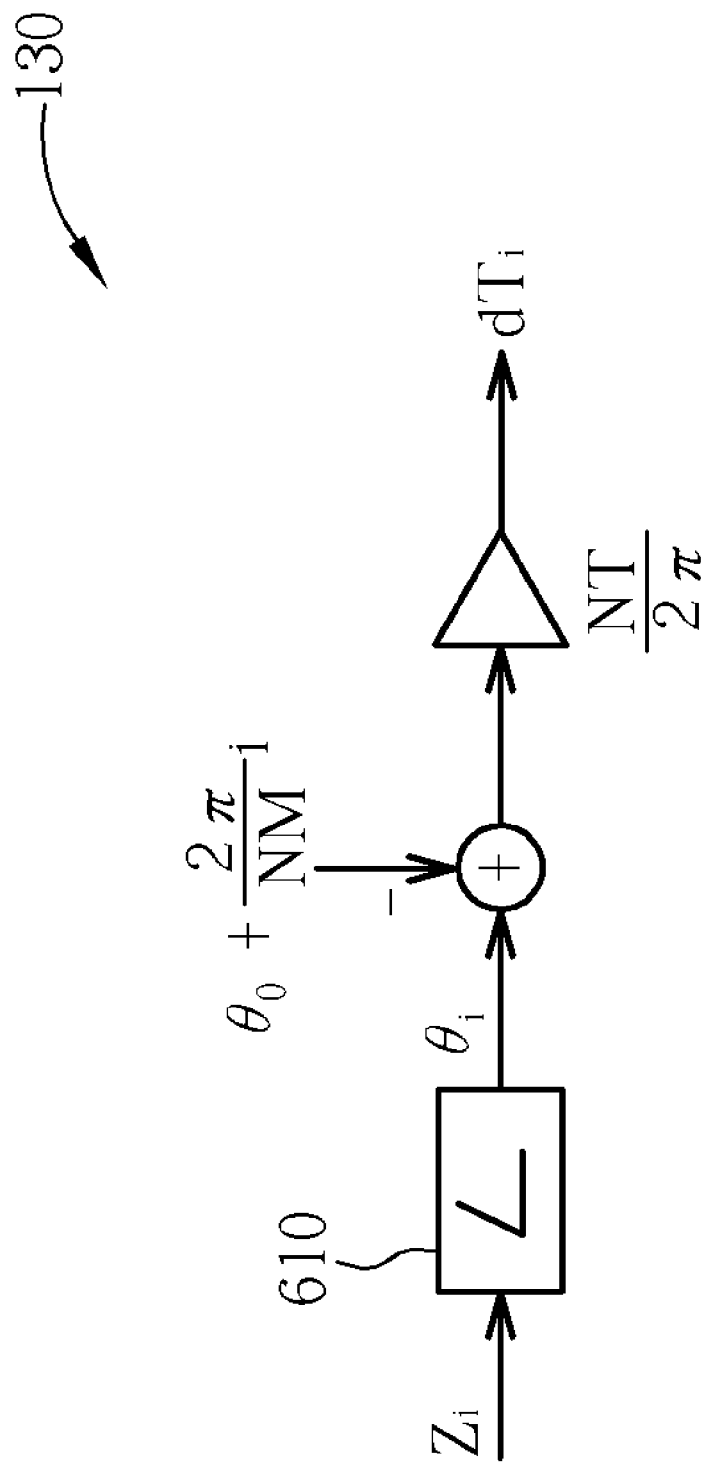
FIG. 6 shows the calculation unit shown in FIG. 1.

According to Eq. (5), the detailed circuitry of the calculation unit 130 is shown in FIG. 6. The argument calculation unit 610 calculates the argument $\theta_i$ of the complex number $Z_i$. Then the argument $\theta_i$ is compared with an argument of a predetermined ADC, e.g., $ADC_0$, and a theoretical phase difference, and is further multiplied by a ratio $NT/2\pi$. As a result, the timing error $dT_i$ is obtained.

Figure 7:
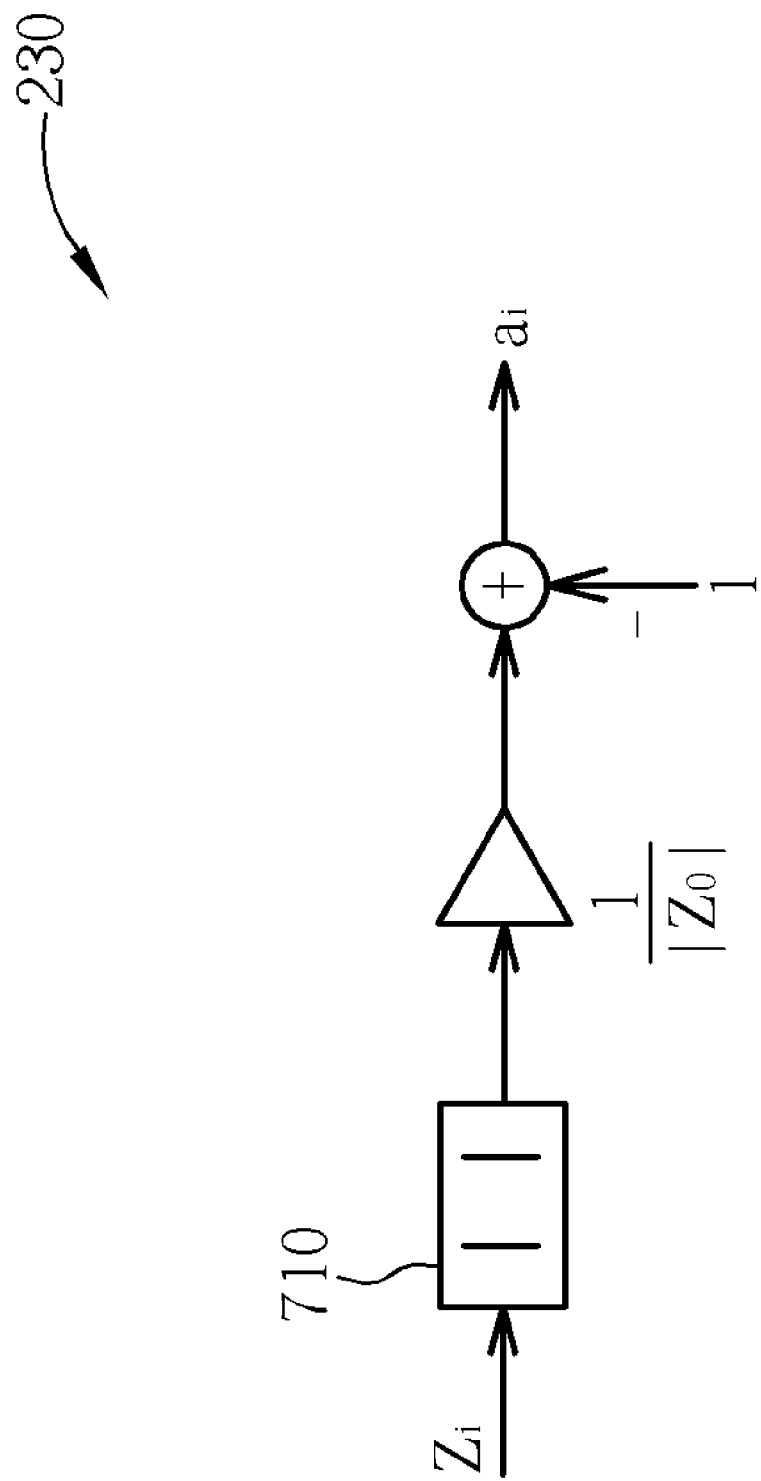
FIG. 7 shows the calculation unit shown in FIG. 2.

Similarly, According to Eq. (6), the detailed circuitry of the calculation unit 230 is shown in FIG. 7. The modulus calculation unit 710 calculates the modulus $|Z_i|$ of the complex number $Z_i$. Then the modulus $|Z_i|$ is compared with a modulus of a predetermined ADC, e.g., $ADC_0$. After normalization, the gain error $a_i$ is obtained.

Figure 8:
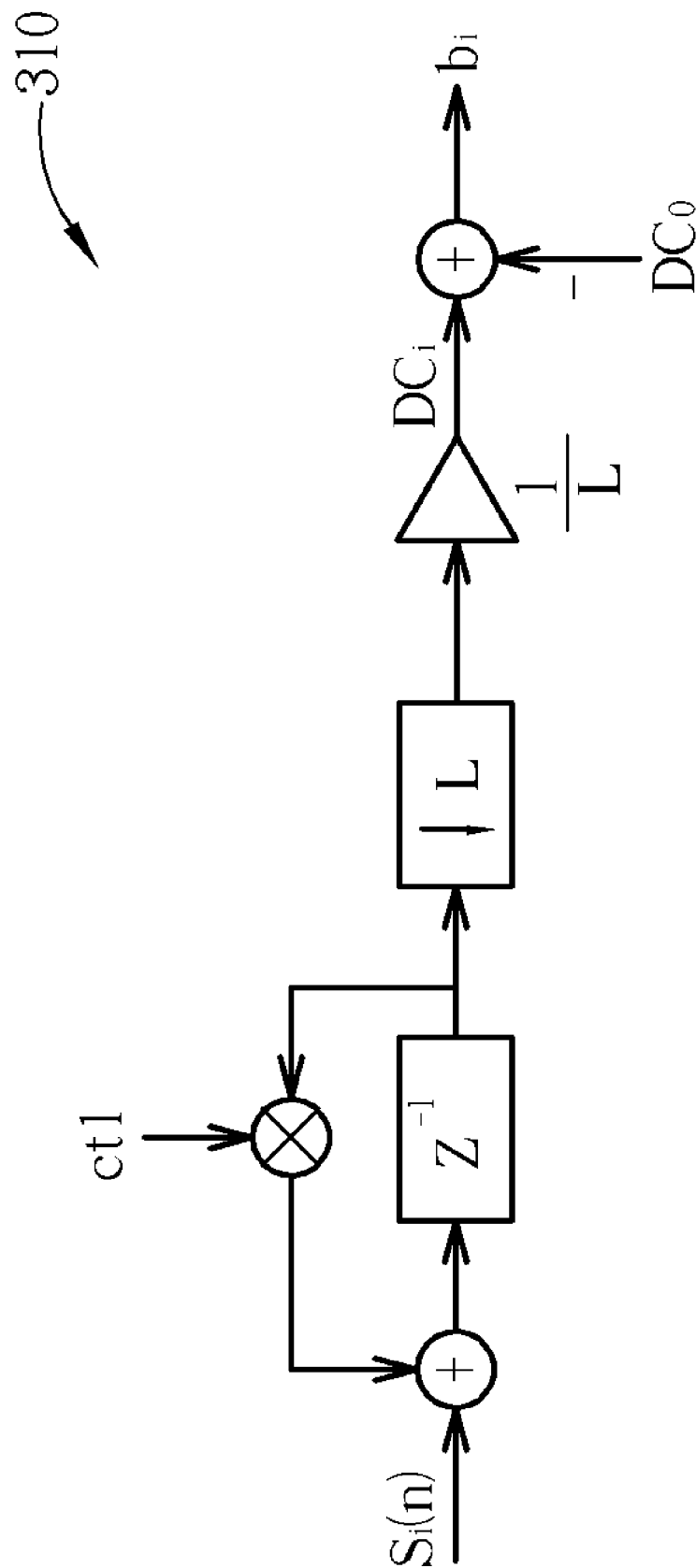
FIG. 8 shows the calculation unit shown in FIG. 3.

The detailed circuitry of the calculation unit 310 shown in FIG. 3 is illustrated in FIG. 8. It is similar to the converting circuit 120 shown in FIG. 4. The sampled data $S_i(n)$ are accumulated. After L data are processed, the average of the result is calculated. The average value $b_i$ is the offset of the $(i+1)^{th}$ $ADC_i$.

Figure 9:
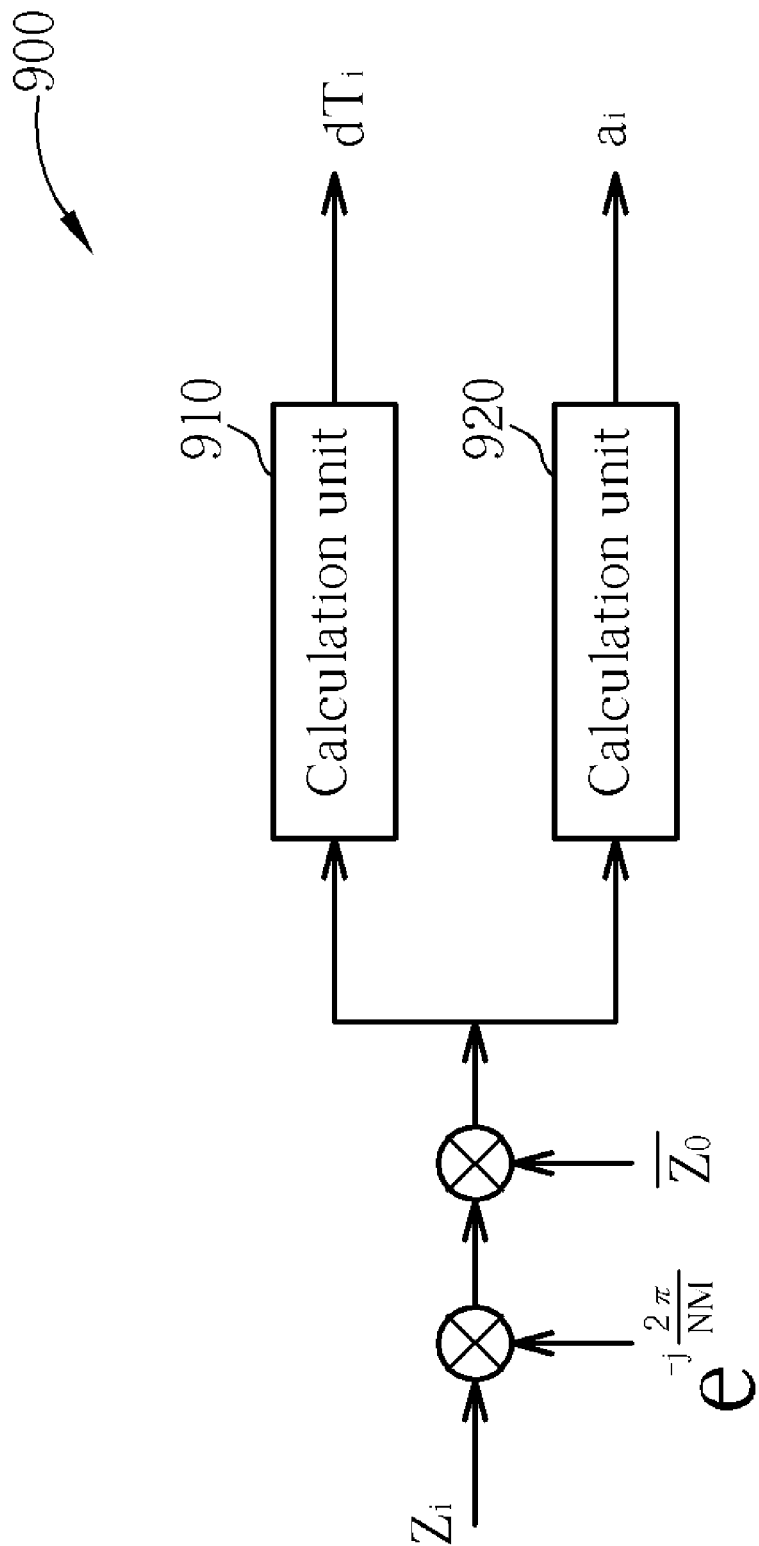
FIG. 9 shows a calculation unit for calculating a timing error and a gain error simultaneously.

FIG. 9 shows a calculation circuit 900 that simultaneously calculates the timing error and the gain error to facilitate the operations of the calculation unit 130 and the calculation unit 230. The complex number is multiplied by a vector $e^{-j2\pi i/NM}$ and then multiplied by a complex conjugate, e.g., $\overline{Z_0}$, of a predetermined ADC, e.g., $ADC_0$. A complex number $Z_i' = Z_i \cdot \overline{Z_0} \cdot e^{-j2\pi i/NM}$ is therefore obtained. Consequently, the timing error $dT_i$ and the gain error $a_i$ are respectively estimated by two calculation units 910 and 920. The formulas utilized by the calculation units 910 and 920 are listed below:

$$a_i \approx \frac{\text{Re}\{Z_i' - Z_0'\}}{Z_0'} \qquad \text{Eq. (8)}$$

$$dT_i \approx \frac{\text{Im}\{Z_i'\} \times N}{2\pi \text{Re}\{Z_i'\}} \times T \qquad \text{Eq. (9)}$$

The first, the second, and the third embodiments described above are for timing error correction, gain error correction, and offset error correction respectively. Ideally, any two of them can be combined to correct two errors at one time. Furthermore, these three embodiments can be combined together to correct all three errors at the same time.

Please note that all formulas mentioned above can be transformed to other forms to simplify the calculation.

Figure 10:
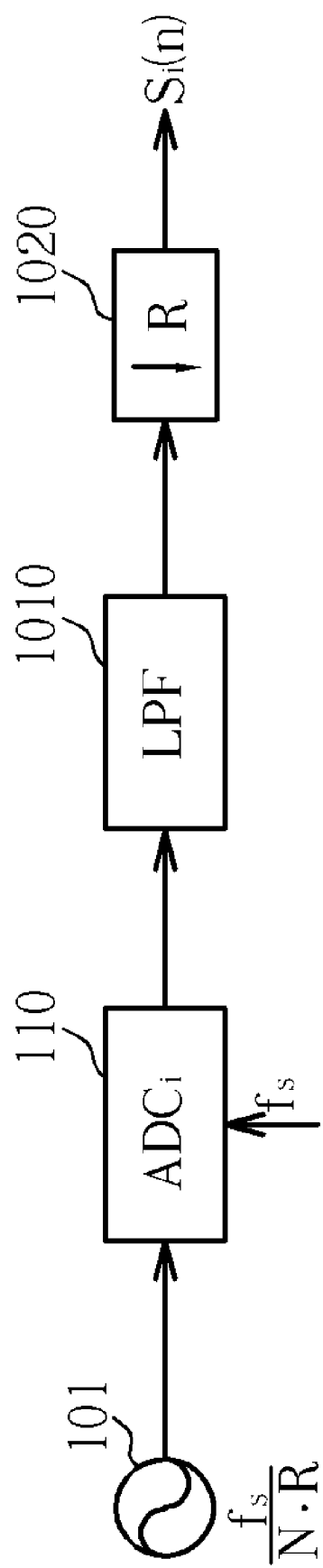
FIG. 10 is a plot illustrating a down-converted signal sampled by an ADC and a down-sampler.

Moreover, to further reduce the complexity of calculation in the digital domain and to simplify the signal generator 101, the output signal of the signal generator 101 is down converted by R in advance and then is sampled with an R-multiplied sampling frequency. The circuitry for accomplishing this operation is shown in FIG. 10. The output signal of the signal generator 101 is down converted by R. The low pass filter (LPF) 1010 filters out the aliasing components generated by the sampling process of the ADC 110 and ensures a high signal-to-noise ratio. The down sampling circuit 1020 down-samples the sampled data with R multiple. As a result, the sampled data $S_i(n)$ with the same number are obtained. Then the sampled data $S_i(n)$ are processed by the converting circuit 120 or the calculation unit 310.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for estimating an error of a time-interleaved analog-to-digital converter (ADC), comprising:
    utilizing a first ADC of the time-interleaved ADC to sample an input signal with a sampling-frequency $f_0$ to generate a first sampled data;
    utilizing a second ADC of the time-interleaved ADC to sample the input signal with the sampling-frequency $f_0$ to generate a second sampled data;
    respectively converting the first and the second sampled data by a first single-point FFT unit and a second single-point FFT unit according to a frequency component of the input signal to generate a first complex number $Z_1$ and a second $Z_2$ complex number, wherein the first complex number $Z_1$ and the second $Z_2$ complex number are corresponding to the same frequency; and
    generating an estimated value of the error according to the first and the second complex numbers.

2. The method of claim 1, wherein the input signal is a sine-wave signal.

3. The method of claim 1, wherein the frequency of the input signal is less than half of the sampling-frequency $f_0$.

4. The method of claim 1, further comprising:
    down sampling the first and the second complex numbers.

5. The method of claim 2, further comprising:
    generating a timing estimated value of the estimated value according to a first argument $\theta_1$ of the first complex number $Z_1$ and a second argument $\theta_2$ of the second complex number $Z_2$.

6. The method of claim 5, the timing estimated value is proportional to $\lfloor(\theta_2-\theta_1)_{mod(2\pi)}-\phi\rfloor$, wherein $\psi$ is a predetermined phase difference of the sampling-frequency $f_0$ between the first and the second ADC.

7. The method of claim 6, the timing estimated value is about $$\frac{N}{2\pi f_0}[(\theta_2-\theta_1)_{mod(2\pi)}-\varphi],$$

wherein N means the sampling-frequency is N times than the frequency of the input signal.

8. The method of claim 5, further comprising:
according to the timing estimated value to compensate a timing error of the time-interleaved ADC.

9. The method of claim 2, further comprising:
generating a gain estimated value of the estimated value according to a first modulus $|Z_1|$ of the first complex number $Z_1$ and a second modulus $|Z_2|$ of the second complex number $Z_2$.

10. The method of claim 9, wherein the gain estimated value is about $$\frac{|Z_2|-|Z_1|}{|Z_1|}.$$

11. The method of claim 9, further comprising:
according to the gain estimated value to compensate a gain error of the time-interleaved ADC.

12. The method of claim 2, further comprising:
respectively averaging the plurality of first sampled data and the plurality of second sampled data to generate a first average value $b_1$ and a second average value $b_2$; and
generating an offset error of the estimated value according to the first average value $b_1$ and the second average value $b_2$.

13. The method of claim 12, wherein the offset error is about $b_2-b_1$.

14. The method of claim 12, further comprising:
according to the offset error to compensate an offset error of the time-interleaved ADC.

15. An apparatus for estimating an error of a time-interleaved analog-to-digital converter (ADC), comprising:
a first ADC to sample an input signal with a sampling-frequency $f_0$ to generate a first sampled data;
a second ADC to sample the input signal with the sampling-frequency $f_0$ to generate a second sampled data;
a first single-point FFT, coupled to the first ADC, for converting the first sampled data according to a frequency component of the input signal to generate a first complex number $Z_1$;
a second single-point FFT, coupled to the second ADC, for converting the second sampled data according to the frequency component of the input signal to generate a second complex number $Z_2$, wherein the first complex number $Z_1$ and the second $Z_2$ complex number are corresponding to the same frequency; and
an estimator, coupled to the converter, to generate an estimated value of the error according to the first and the second complex numbers.

16. The apparatus of claim 15, wherein the input signal is a sine-wave signal.

17. The apparatus of claim 15, wherein the frequency of the input signal is less than half of the sampling-frequency $f_0$.

18. The apparatus of claim 15, further comprising:
a compensator to compensate at least one of a timing and a gain errors of the time-interleaved ADC according to the estimated value.

19. The apparatus of claim 15, the converter comprising:
a calculator to respectively average the plurality of first sampled data and the plurality of second sampled data to generate a first average value $b_1$ and a second average value $b_2$; and
wherein the estimator to generate a offset error of the error according to the first average value $b_1$ and the second average value $b_2$.

* * * * *